(12) United States Patent
Cheng et al.

(10) Patent No.: US 7,642,176 B2
(45) Date of Patent: Jan. 5, 2010

(54) ELECTRICAL FUSE STRUCTURE AND METHOD

(75) Inventors: Hsin-Li Cheng, Hsin-Chu (TW);
Chia-Jung Lee, Hsin-Chu (TW);
Chin-Shan Hou, Hsin-Chu (TW);
Wei-Ming Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 5 days.

(21) Appl. No.: 12/106,759

(22) Filed: Apr. 21, 2008

(65) Prior Publication Data

US 2009/0261450 A1 Oct. 22, 2009

(51) Int. Cl.
*H01L 21/326* (2006.01)
*H01L 21/479* (2006.01)
(52) U.S. Cl. .............................. 438/467; 257/E23.149; 257/529; 257/209
(58) Field of Classification Search .................. 257/209, 257/E23.149, 529, E23.15, E21.592, E21.596; 438/215, 281, 333, 467, 600, 601
See application file for complete search history.

(56) References Cited

U.S. PATENT DOCUMENTS

| | | | | |
|---|---|---|---|---|
| 6,433,404 | B1 * | 8/2002 | Iyer et al. ................... | 257/529 |
| 6,661,330 | B1 * | 12/2003 | Young ........................ | 337/297 |
| 2005/0189613 | A1 * | 9/2005 | Otsuka et al. ............... | 257/529 |
| 2005/0285222 | A1 | 12/2005 | Thei et al. | |
| 2008/0186788 | A1 * | 8/2008 | Barth ....................... | 365/225.7 |

\* cited by examiner

*Primary Examiner*—Davienne Monbleau
*Assistant Examiner*—Shweta Mulcare
(74) *Attorney, Agent, or Firm*—Slater & Matsil, L.L.P.

(57) ABSTRACT

An electrical fuse and a process of programming the same are presented. An electrical fuse comprises a lower level silicide layer on a non-doped or lightly-doped polysilicon layer, an upper level conductive layer, and a tungsten contact coupled between the lower level silicide layer and the upper level conductive layer. The tungsten contact and a neck portion of the silicide layer are the programmable portion of the electrical fuse. High post-programming resistance is achieved by a first programming phase that depletes silicide in the silicide layer, followed by a second programming phase that depletes tungsten in the tungsten contact.

22 Claims, 8 Drawing Sheets

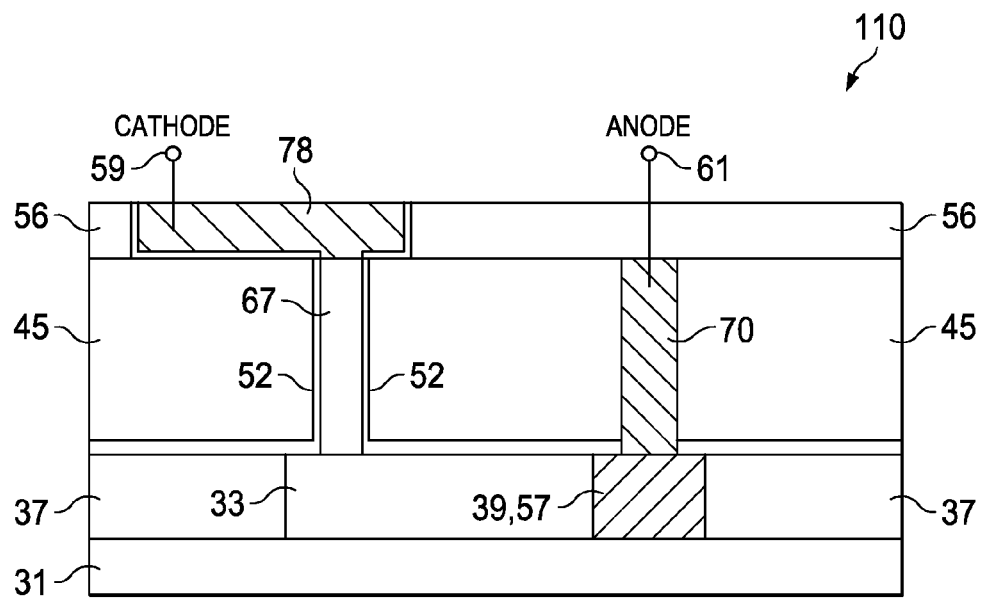
FIG. 10
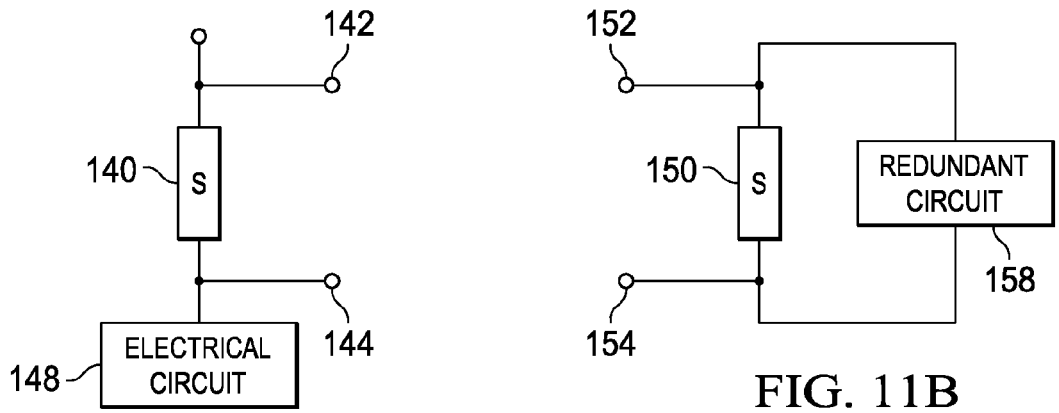
FIG. 11A
FIG. 11B
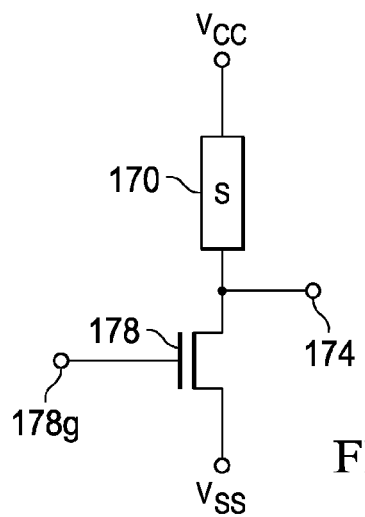
FIG. 12

ELECTRICAL FUSE STRUCTURE AND METHOD

TECHNICAL FIELD

This invention relates generally to an integrated circuit structure and method and more particularly to an electrical fuse and process of programming the same.

BACKGROUND

In the semiconductor industry, fuse elements are widely used in integrated circuits for a variety of purposes, such as improving manufacturing yield or customizing a generic integrated circuit. For example, by programming fuses to replace defective circuits on a chip with redundant circuits on the same chip, manufacturing yields can be significantly increased. Replacing defective circuits is especially useful for improving manufacturing yield of the memory chips since memory chips consist of many identical memory cells and cell groups. By selectively blowing fuses within an integrated circuit that has multiple potential uses, a generic integrated circuit design may be economically manufactured and adapted to a variety of custom uses.

Generally, there are two different methods to disconnect fuses. In one method, the disconnection is carried out by the action of a laser beam, and the fuse is referred to as a laser fuse. In order to zap a laser fuse formed in a chip, an opening in a passivation layer is typically formed allowing the laser direct access to the fuse metal link that is to be cut. Thus, laser fuses are preferably formed close to the surface of a chip in order to avoid cutting deep openings in the passivation layer, which may increase process complexity and decrease the laser repair rate. However, forming fuse elements close to the surface of a chip casts security concerns on protecting the intellectual property of a designed integrated circuit (IC), for example.

In another method, the disconnection of a fuse is carried out by electrical destruction resulting from the electromigration produced by an electrical current. Such a fuse is referred as an electrical fuse, or e-fuse. FIG. 1A illustrates a conventional e-fuse 10 that can be formed in a deep process layer of a chip, thus providing the desired protection of the intellectual property of a designed IC. E-fuse 10 comprises a polysilicon (poly) strip 5 that is formed and patterned over a semiconductor substrate (not shown). Poly stripe 5 is un-doped or lightly-doped, thus exhibiting a high electrical resistance. Formed atop poly stripe 5 is a silicide layer 7 that has a low resistance. The two ends of e-fuse 10 are coupled to the anode and the cathode of a predetermined programming potential, respectively, through conductive features, such as contact/via 3. Before e-fuse 10 is burned out, its resistance is mainly determined by the resistance of the silicide layer 7.

FIG. 1B shows e-fuse 10 when a predetermined programming potential is applied across its ends. The electrical current passes e-fuse 10 primarily through silicide layer 7 due to its low resistance. A known phenomenon named electromigration causes silicide layer 7 to accumulate and agglomerate at the anode end, forming silicide accumulation 9, and to create an electrical discontinuity in e-fuse 10. Therefore, after e-fuse 10 is programmed, the resistance of e-fuse 10 is mainly determined by poly strip 5 so that the resistance is significantly increased. Ideally, a very large, close-to-open resistance of e-fuse 10 is achieved after programming in order to obtain a large IC design window.

While the trend of device feature size scaling continues in advanced technology, the structure of a conventional e-fuse and the described approach of programming a conventional e-fuse have become increasingly problematic in a few ways. Firstly, due to the size shrinkage of an e-fuse in advanced technology, the post-programming resistance of an e-fuse will not be large enough, and the difference between a pre-programming e-fuse resistance and a post-programming e-fuse resistance will become vague. This problem may lead to a significantly lowered repairable rate and reduced IC design window. Secondly, as e-fuse dimension decreases in advanced technology, a detrimental effect known as poly thermal rupture is increasingly prone to occur due to the increased current density on a shrunk poly stripe of an e-fuse. Poly thermal rupture may cause permanent physical damage on a poly stripe, which may, in turn, cast serious reliability risk during the lifetime of an e-fuse.

FIG. 2A illustrates another known e-fuse 20 that may be formed in a deep process layer of a chip. E-fuse 20 comprises top conductive layer 11, bottom conductive layer 15, and contact 13 coupled in between. In programming e-fuse 20, top conductive layer 11 and bottom conductive layer 15 are coupled to the cathode and the anode of a predetermined programming potential, respectively. Similarly, the effect of electromigration causes the metal material of contact 13 to accumulate and agglomerate at the anode end of e-fuse 20, forming contact metal accumulation 19. This results in the depletion of the metal material of contact 13, leaving void 17 in the region of contact 13. The void thus created leads to a significantly increased fuse resistance. A resultant structure of e-fuse 20 after programming is shown in FIG. 2B.

As a consequence, the so-called pure contact fuse described above is susceptible to an effect known as metal reflow. The high current density in advanced technology may melt the conductive material used for the top conductive layer 11 and may cause the conductive material of conductive layer 11 to refill the void 17 created during the fuse programming process. The undesired refill process may nullify a pre-programmed e-fuse and causes serious reliability concerns in an IC. This detrimental effect is prone to occur when low melting-point metal materials, such as copper (Cu) or aluminum (AL), are used for top conductive layer 11.

SUMMARY OF THE INVENTION

The preferred embodiment of the present invention presents electrical fuse structures and a process of programming the same.

In one preferred embodiment, an electrical fuse comprises an upper conductive layer that comprises a first conductive material having a first melting-point. The electrical fuse also comprises a lower polysilicon layer having a first region and a second region, and a first contact comprising a second conductive material having a second melting-point higher than the first melting-point. The first contact is coupled to the upper conductive layer and to the first region of the lower polysilicon layer, wherein a bottom portion of the first contact being voided. The electrical fuse further comprises accumulation of the second conductive material and silicide at the second region of the lower polysilicon layer.

In another preferred embodiment, an electrical fuse comprises an upper conductive layer that includes a material having a melting-point not lower than that of tungsten. The electrical fuse also comprises a lower polysilicon layer that has a first region and a second region. The electrical fuse further comprises a first tungsten contact coupled to the upper conductive layer and the first region of the lower polysilicon layer, the first contact being substantially completely voided.

The electrical fuse even further comprises tungsten and silicide accumulation at the second region of the lower polysilicon layer.

In a further embodiment, an electrical fuse comprises an upper conductive layer, a lower polysilicon layer having a first region and a second region, and a first contact coupled to the upper conductive layer and to the first region of the lower polysilicon layer, a bottom portion of the first contact being voided. The electrical fuse also comprises accumulation of the material of the first contact and silicide at the second region of the lower polysilicon layer, wherein the voided bottom portion of the first contact has a height between about 20% and about 80% of a full height of the first contact.

BRIEF DESCRIPTION OF THE DRAWINGS

For a more complete understanding of the present invention, and the advantages thereof, reference is now made to the following descriptions taken in conjunction with the accompanying drawings, in which:

FIG. 10 illustrates a "post-program" fuse structure in another preferred embodiment of the present invention;

FIGS. 11A-11B illustrate applications of the preferred embodiment; and

FIG. 12 illustrate a circuit for blowing out fuses.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention present novel e-fuse structures and methods of programming the e-fuses. The e-fuse structures in preferred embodiments comprise an upper-level conductive layer, a lower-level poly layer, and a contact coupled between the upper-level conductive layer and the lower-level poly layer. The lower-level poly layer and the contact are the programmable portion of the e-fuse. The e-fuse can be burned out by applying a voltage on external pads that are coupled to the lower-level poly layer and the upper-level conductive layer. To simplify description, the lower-level poly layer is also referred to as poly layer or poly strip throughout the description. The upper-level conductive layer is also referred to as upper-level conductive line, conductive layer or conductive line. Also, known terms of "program" and "blow out" will be interchangeably used throughout the description to refer to the process of converting an e-fuse from a low resistance state to a high resistance state.

Figure 1A:
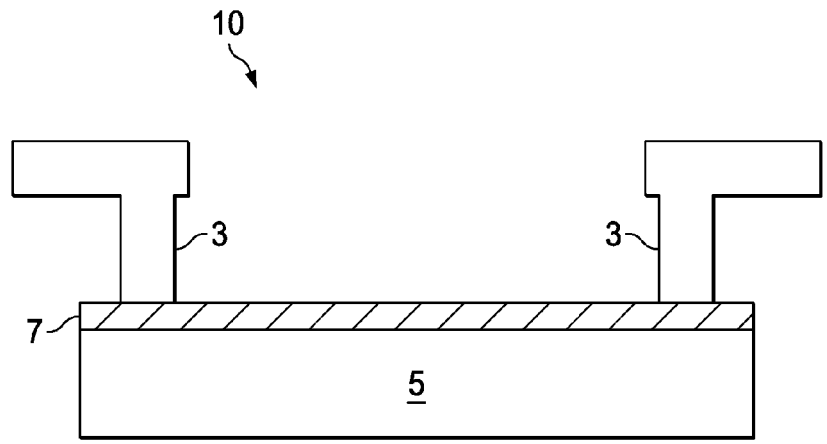
FIGS. 1A and 1B illustrate a conventional electrical fuse.
Figure 1B:
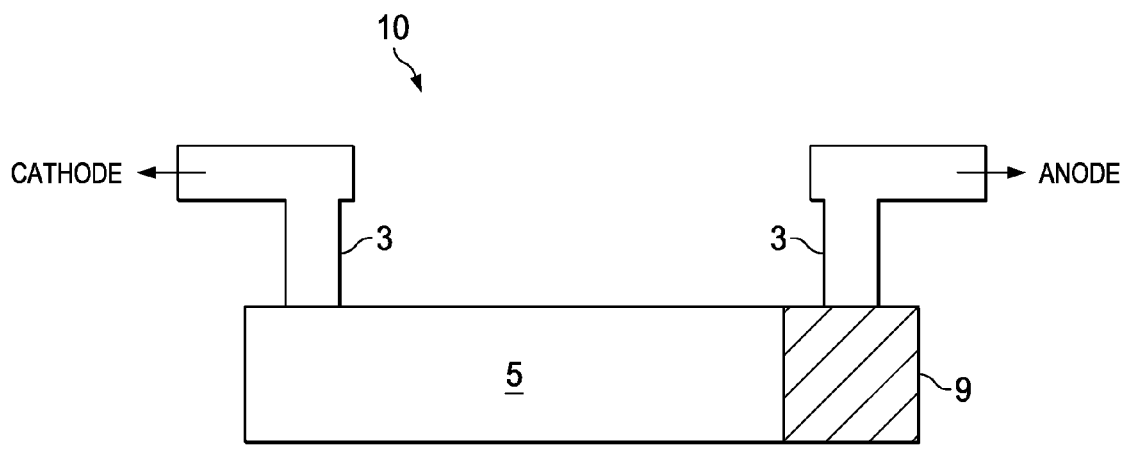
Figure 2A:
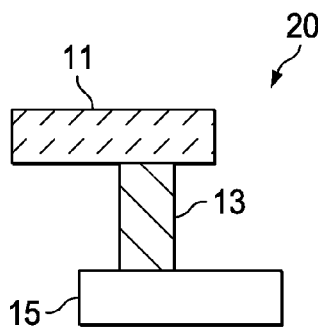
FIGS. 2A and 2B illustrate a conventional electrical fuse.
Figure 2B:
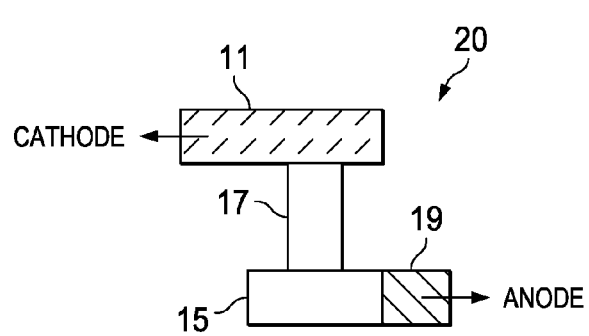
Figure 3:
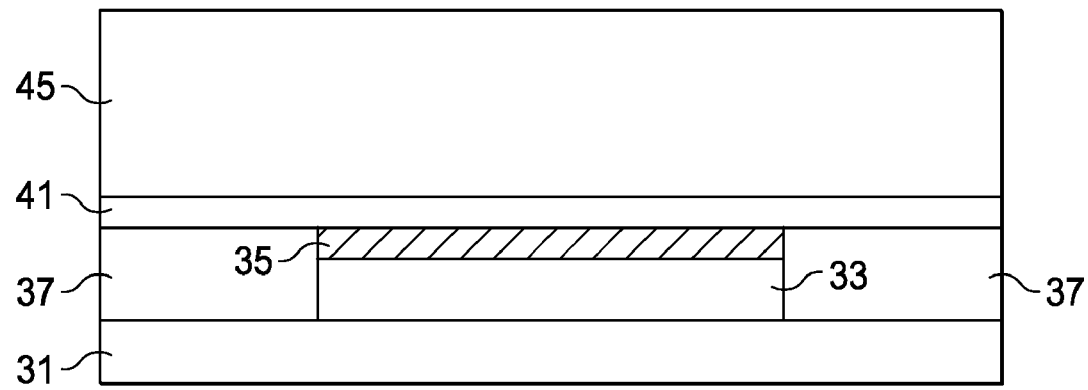
FIGS. 3 through 6 are cross-sectional views of intermediate stages in the making of a preferred embodiment of the present invention.

FIGS. 3 through 6 are cross-sectional views of intermediate stages in the making of a preferred embodiment of an e-fuse of the present invention. It is to be noted that the cross-sectional views are taken in a plane perpendicular to the length direction of the conductive lines formed. Therefore, conductive lines appear to be rectangles. FIG. 3 illustrates the formation of poly strip 33 on base material 31. Known processes, such as chemical vapor deposition (CVD), photolithography, and plasma etch may be used to form poly strip 33. Poly strip 33 is non-doped or lightly-doped, therefore having a high sheet resistance. A silicide layer 35 is formed on top of poly stripe 33. In doing so, a layer of refractory metal such as nickel (Ni), cobalt (Co), or tungsten (W) is sputtered onto the wafer. The wafer is then heated, causing a chemical reaction between the exposed poly stripe 33 and the metal. An etch process then removes all the unreacted metal, leaving behind low resistance silicide layer 35. Base material 31 is typically an inter-layer dielectric (ILD) also sometimes known as a pre-metal dielectric (PMD) or an inter-metal dielectric (IMD) layer. It can also be formed of other non-conductive materials such as a contact etching stop layer (CESL).

An ILD layer 37 is formed beside poly strip 33 and silicide layer 35. The ILD layer 37 is preferably silicon dioxide deposited using, e.g., tetraethyl orthosilicate (TEOS), chemical vapor deposition (CVD), plasma enhanced CVD (PECVD), low pressure CVD (LPCVD), or other well-known deposition techniques. ILD layer 37 can also be other materials such as phospho-silicate glass (PSG) or other known materials. Typically, ILD layer 37 has a low dielectric constant value (K value) so that the parasitic capacitance between conductive lines is reduced.

FIG. 3 also shows an etching stop layer (ESL) 41 formed on silicide layer 35. The ESL 41 is preferably a dielectric formed of an oxide or other dielectric materials such as silicon nitride. An ILD 45 is formed on ESL 41. ILD 45 provides insulation between the lower-level poly layer 33, silicide layer 35 and overlying conductive lines that will be formed subsequently.

Figure 4:
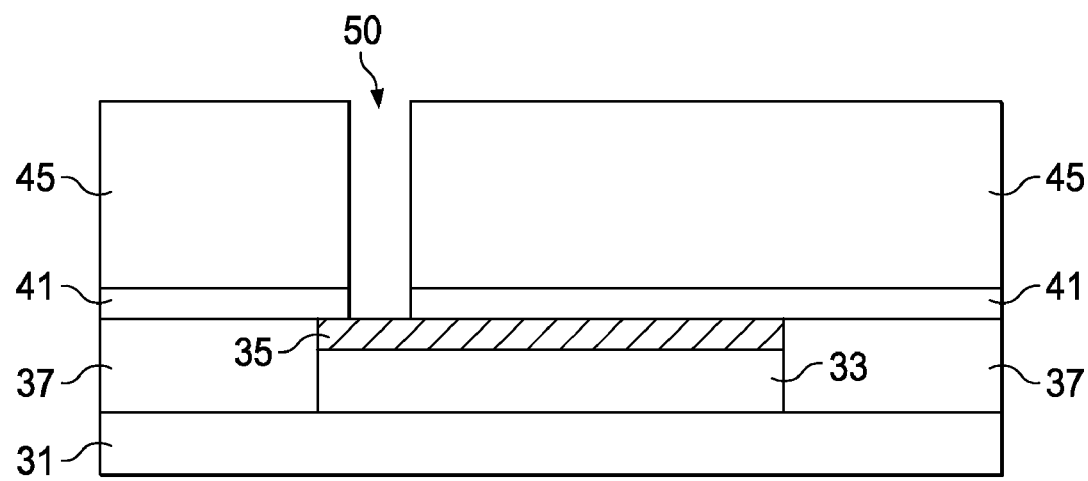

FIG. 4 illustrates a contact opening 50 formed in ILD 45 and ESL 41, exposing silicide layer 35 close to one end of poly strip 33. In doing so, a photo resist material (not shown) is formed and patterned over the ILD 45. The contact opening 50 is formed in ILD 45 and stops at the ESL 41. The ELS 41 protects the underlying silicide layer 35 when ILD 45 is etched. Next, the exposed portion of ESL 41 is etched. Because the ESL 41 is quite thin relative to the ILD 45, process control and end-point detection may be more closely monitored, thus limiting the likelihood of over-etching through the underlying silicide layer 35.

Figure 5:
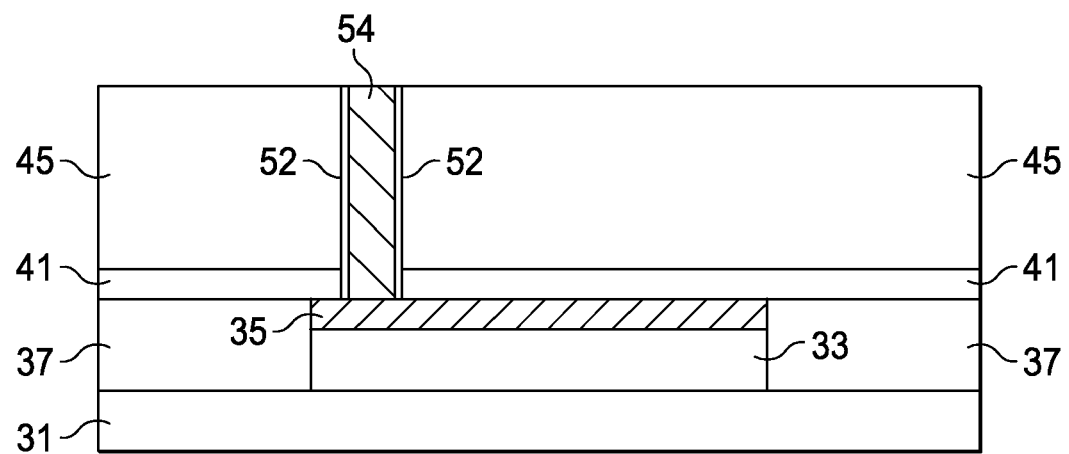

FIG. 5 illustrates the device after contact 54 is formed in contact opening 50. In one preferred embodiment, contact 54 is formed of metal, such as tungsten, aluminum, copper, silver, gold, or combinations or other well-known alternatives thereof. Preferably, contact 54 has a composite structure, including a barrier layer 52 formed on the inner surface of contact opening 50 of a material comprising titanium, titanium nitride, tantalum, tantalum nitride, silicon carbide, silicon oxycarbide, or combinations thereof. The barrier layer 52 prevents the contact material diffusing into ILD 45, which would cause device failure. The thickness of the barrier layer 52 is preferably between about 10 Å to about 1000 Å, and more preferably about 300 Å. It is noted, however, barrier layer 52 is generally not formed at the bottom of contact opening 50. The metal materials used for contact 54 have a direct contact with the underlying silicide layer 35.

Figure 6:
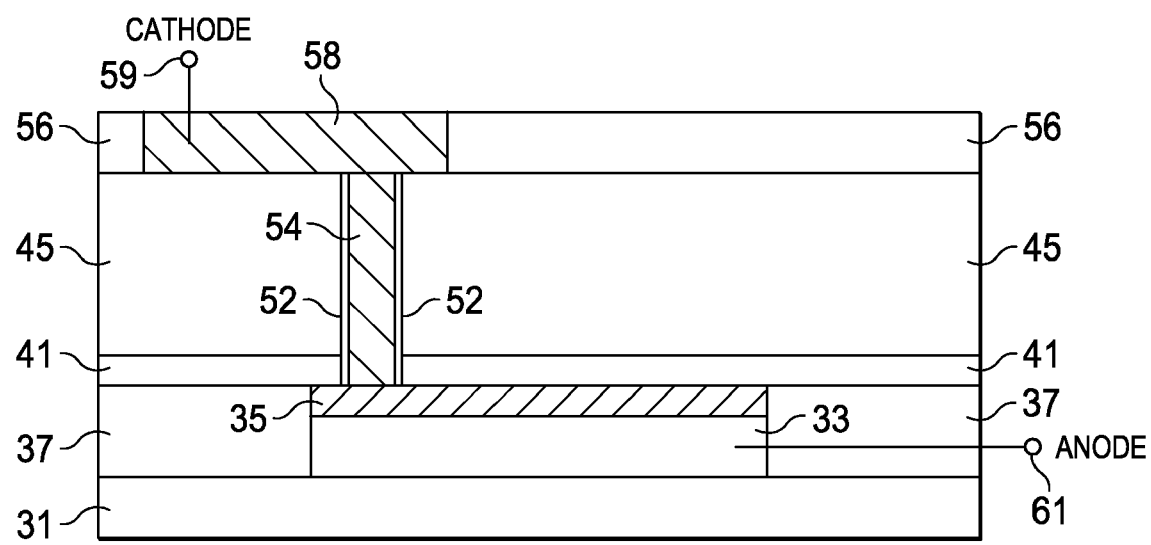

Continuing in FIG. 6, upper-level conductive line 58 and ILD 56 are then formed through known processes. The upper-level conductive line 58 is in a layer higher than the layer in which the lower-level poly layer 33 is formed. In one preferred embodiment, upper-level conductive line 58 is made of high melting-point metal material, such as tungsten. In another preferred embodiment, upper-level conductive line 58 may be formed of other suitable metal materials, such as, aluminum, copper, silver, gold, and combinations thereof. In additional and/or alternative embodiments, upper-level conductive line 58 may be formed of other suitable conductive materials, such as doped polysilicon.

Lower-level poly layer 33 and upper-level conductive line 58 are coupled to external pads 59 and 61, respectively. External pads 59 and 61 may be formed at the surface of a chip (not shown). The features formed in above steps results in an e-fuse that is defined in a region comprising poly layer 33, silicide layer 35, contact 54, and upper-level conductive line 58. By applying a voltage to external pads 59 and 61, a current flow through the fuse may result in an electrical discontinuity in the fuse region.

Figure 7A:
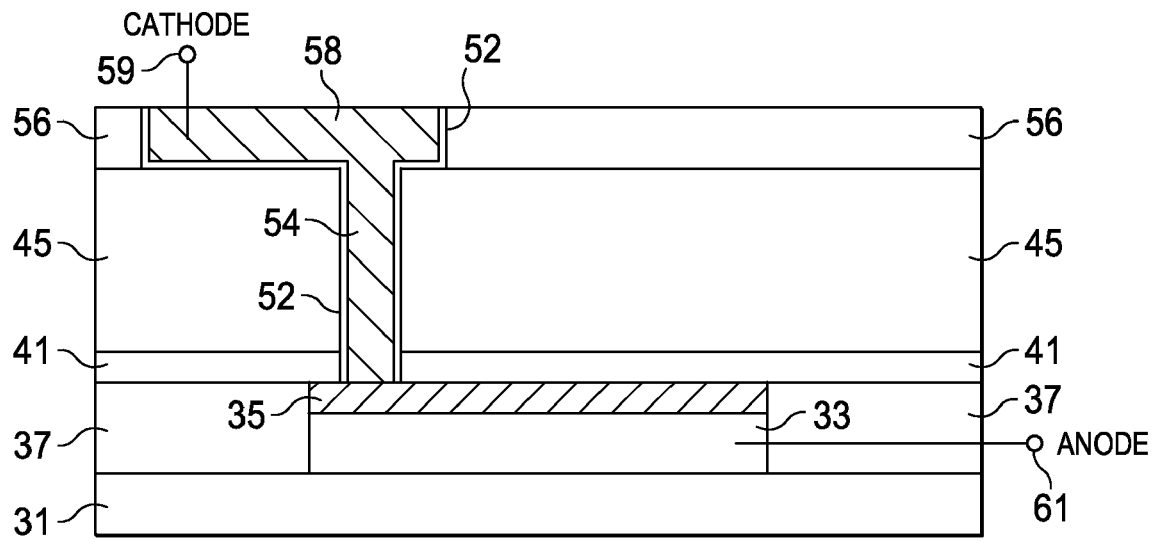
FIGS. 7A-7B are cross-sectional views of intermediate stages in the making of other preferred embodiments of the present invention.

In another preferred embodiment, a copper or tungsten dual-damascene process may be performed to form contact 54 and upper-level copper line 58 in a common process step. The resulting structure is shown in FIG. 7A. FIG. 7A illustrates an e-fuse structure with upper-level tungsten line 58 and contact 54. A barrier layer 52 is conformally deposited in the openings in ILD 45 and 56, except for the exposed region of layer 35, where tungsten is used as the filling material. A CMP is performed to planarize the top surface of upper-level conductive line 58.

The e-fuses in the preferred embodiments of the present invention can be formed at different levels in a wafer based on the requirements of the circuit design. In the embodiments illustrated above, an e-fuse may be formed deep under the wafer surface between two adjacent interconnect conductive layers in an IC, such as a polysilicon layer and the first interconnect metal layer (M1). Furthermore, the horizontal dimension of the lower-level poly layer 33 and the silicide layer 35 may be significantly larger than the vertical dimension (height) of contact 54.

Figure 7B:
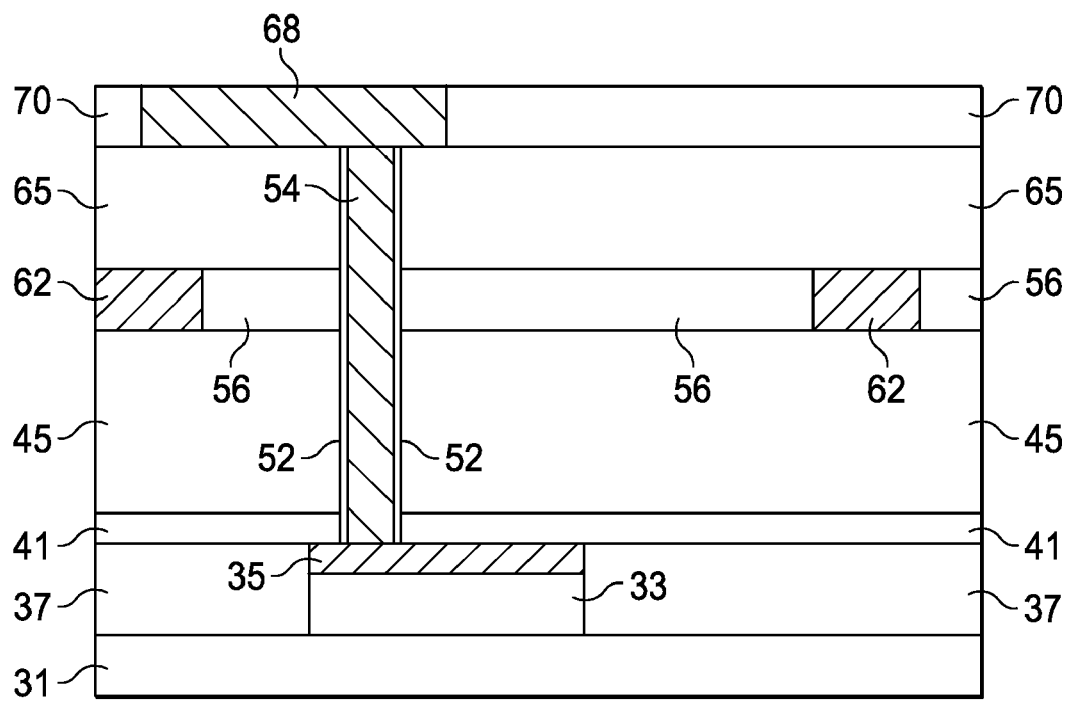

In alternative and/or additional preferred embodiments, an e-fuse can be also formed between a polysilicon layer and an upper-level conductive layer that is not in the immediate interconnect metal layer above the polysilicon layer. As an example, FIG. 7B shows an portion of an IC where an e-fuse is formed between lower-level poly layer 33 and upper-level conductive layer 68 in the second interconnect metal layer (M2) in a wafer. This e-fuse has a structure where the horizontal dimension of the lower-level poly layer 33 and silicide layer 35 are significantly smaller than the height of contact 54. Also shown in FIG. 7B are other conductive features 62 formed in M1, in order to provide a reference on the relative positions of the various conductive layers in an IC. As can be appreciated by those skilled in the art, the current e-fuse configuration occupies a smaller area on a wafer. This e-fuse structure facilitates fabricating ICs requiring an increased level of device density. In other embodiments of the present invention, the cross section of contact 54 can take the shape of a square, rectangle, circle or other shapes. Contact 54 can also be tapered. In preferred embodiments, contact 54 has a height between about 500 Å to about 10000 Å.

Figure 8A:
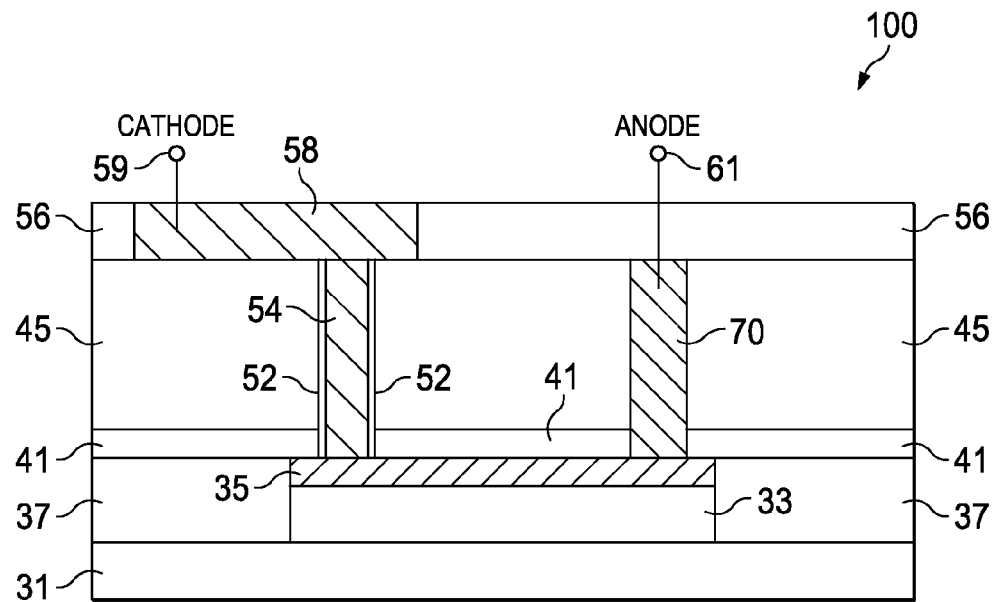
FIGS. 8A-8D illustrate a method used to "program" an e-fuse in a preferred embodiment of the present invention.

Staring with FIG. 8A, the mode used to program an e-fuse in the preferred embodiments are described. FIG. 8A illustrates an e-fuse 100 in one preferred embodiment before programming. E-fuse 100 has a fuse structure similar to those described with respect to FIGS. 6A, 6B, and 7. To simplify description, the fuse structure described in FIG. 6A is used to illustrate the method used to program an e-fuse in the preferred embodiments. Elements described in FIG. 6A may not be described again in detail herein. Also shown in FIG. 8A is contact 70 that couples the other end of poly strip 33 to external pad 61. In order to program or blow out e-fuse 100, external pads 59 and 61 are coupled to the cathode and anode of a predetermined programming potential, respectively, as can be seen in FIG. 8A.

Figure 8B:
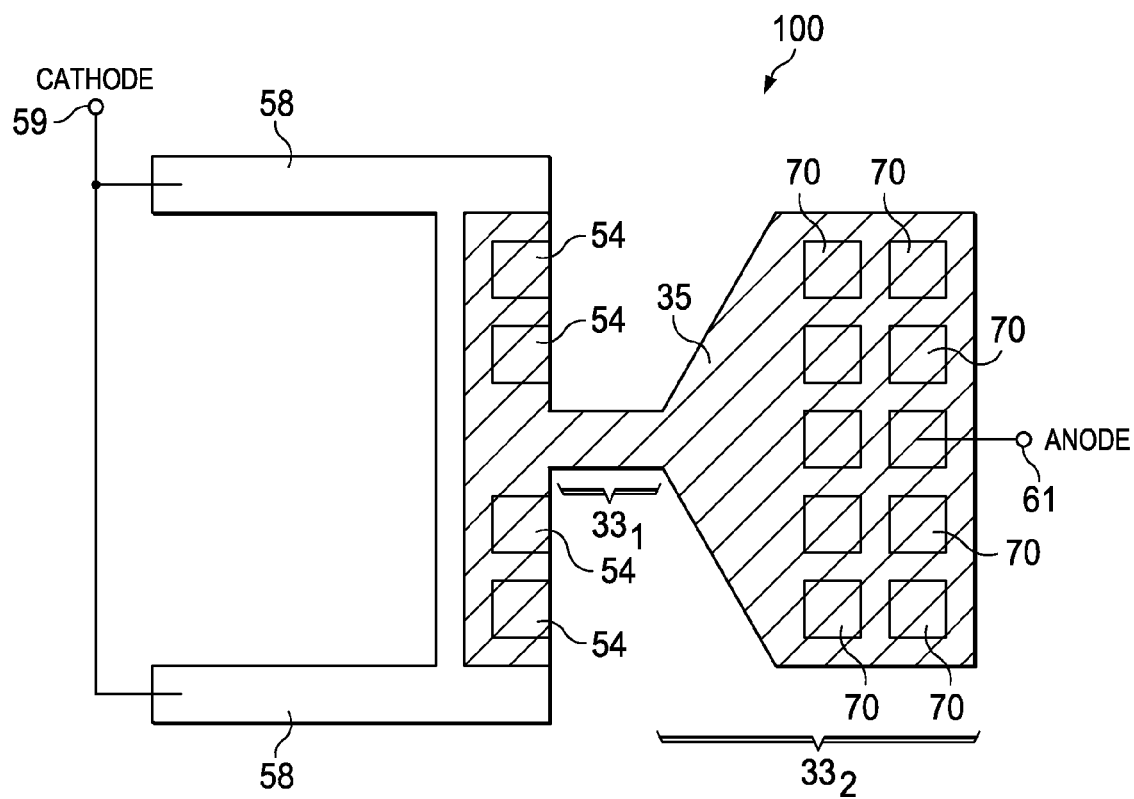

FIG. 8B is a top view of e-fuse 100. One or more contacts 54 couple one end of poly strip 33 to upper-level conductive layer 58. Upper-level conductive layer 58 is coupled to the cathode of an external programming voltage through external pad 59. The portion of poly strip 33 that is coupled to contact 54 has a shape of a neck, as does the silicide layer 35 formed thereon. The neck portion $33_1$ expands in width at the other end of poly strip 33, forming shoulder portion $33_2$. Shoulder portion $33_2$ is significantly wider than neck portion $33_1$, and is coupled to the anode of an external programming voltage through contact group 70 and external pad 61. Contact group 70 comprises an array of contacts and is able to sustain higher current density than contact 54.

It is noted that, in preferred embodiments, the poly strip 33 and contact 54 are adapted to be the programmable portion of an e-fuse. Preferably, when an external programming voltage is applied to e-fuse 100, the blow out on neck portion $33_1$ occurs prior to the blow out on contact 54. In realizing the preferred blow out order, the current densities in the various portions of e-fuse 100 are described with respect to FIGS. 8C and 8D.

Figure 8C:
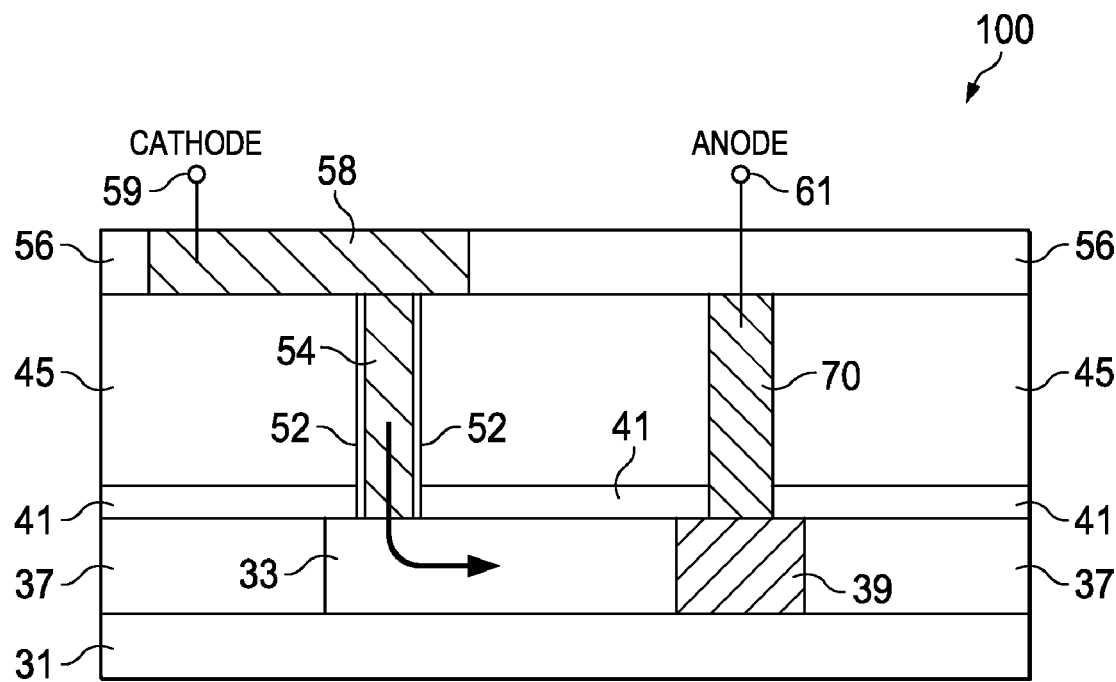

FIG. 8C illustrates a first phase of programming when an external programming voltage is applied to e-fuse 100. An electrical current is produced passing through e-fuse 100. Under the preferred programming condition as described above, a flow of electrons is created in e-fuse 100 (shown as an arrow in FIG. 8C), flowing from upper-level conductive layer 58 into poly strip 33 via contact 54. Because silicide layer 35 formed on the top of poly strip 33 has a much lower electrical resistance, the electron flow concentrates primarily in silicide layer 35. Also, because of its narrow dimension, silicide layer 35 over the neck portion $33_1$ of poly strip 33 (see FIG. 8B) has a higher current density than that of the other portions of e-fuse 100, thus blow out on e-fuse 100 first occurs at the neck portion $33_1$ of e-fuse 100. The metallic atoms of silicide layer 35 are "flushed" through the narrow channel of neck portion $33_1$ by the electron flow under the mechanism of electron migration as explained earlier. These metallic atoms accumulate and conglomerate at the wide, shoulder portion $33_2$ of poly strip 33, forming metallic atom accumulation 39. Also, the metallic atom accumulation 39 at shoulder portion $33_2$ may diffuse vertically into the underlying poly strip 33, as shown in FIG. 8C. This first phase of programming is also conveniently referred to as poly silicide migration mode in preferred embodiments, and it continues until the metallic atoms in silicide layer 35 over the neck portion $33_1$ are depleted, leaving a high resistance poly region between contact 54 and shoulder portion $33_2$.

In advanced technology where device density is high, the un-doped or the lightly-doped poly region created between contact 54 and shoulder portion $33_2$ under the poly silicide migration mode may not provide the desired high resistance that distinguishes the partially programmed e-fuse 100 by a clear margin. The programming process continues on e-fuse 100 into a second phase under the contact electron migration mode.

Figure 8D:
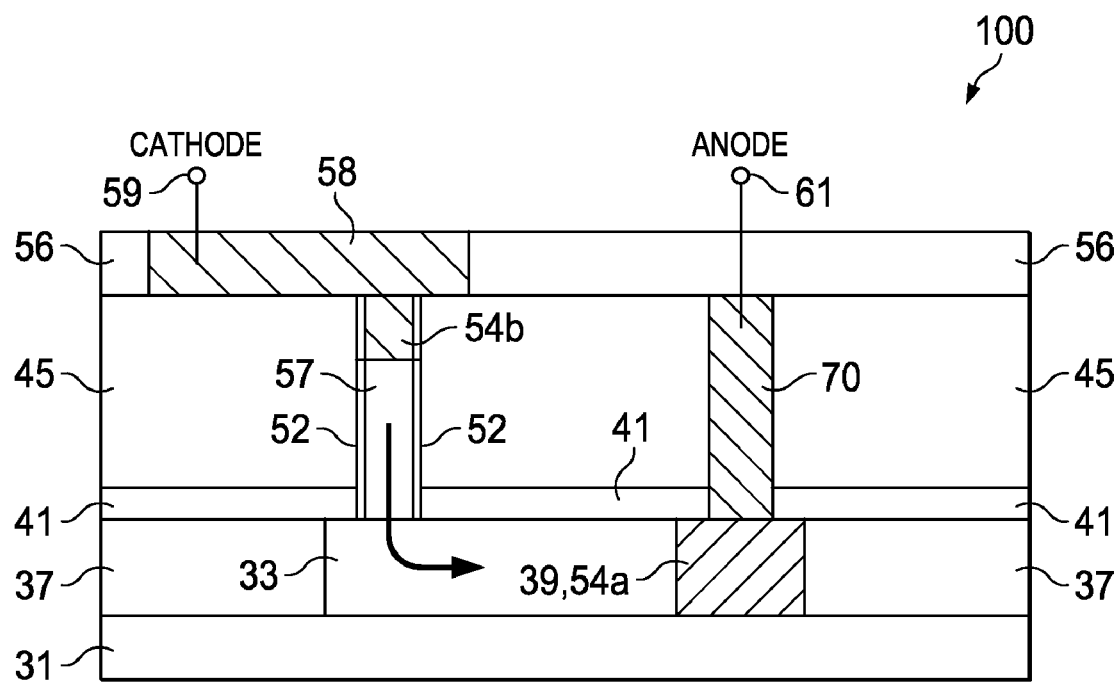

FIG. 8D illustrates the second phase of programming e-fuse 100. When the external programming voltage continues to be applied to e-fuse 100, the effect of electron migration takes place in the region of contact 54. The flow of electrons "flushes" the metallic atoms of contact 54 through the narrow channel of neck portion $33_1$, leaving void 57 in a portion of the region of contact 54. The metallic atoms of contact 54 accumulate and conglomerate at the wide, shoulder portion $33_2$ of poly strip 33. The creation of void 57 causes the electrical current flow in barrier layer 52, thus leading to a significant addition to the fuse resistance created in the first phase. The second phase of programming e-fuse 100 continues until a desired high resistance is achieved in e-fuse 100 that distinguishes a programmed e-fuse 100 with an un-programmed one by a clear margin.

In order to ensure the combined e-fuse 100 program mode happens in the desired order described above, it is preferred that the current density in contact 54 is substantially slightly lower than or close to that in the portion of silicide layer 35 over the neck portion $33_1$ of poly strip 33, but is significantly higher than that of the other portions of e-fuse 100. When this condition is met, the blow out of contact 54 will generally follow the blow out of silicide layer 35 over the neck portion $33_1$ of poly strip 33.

Figure 9A:
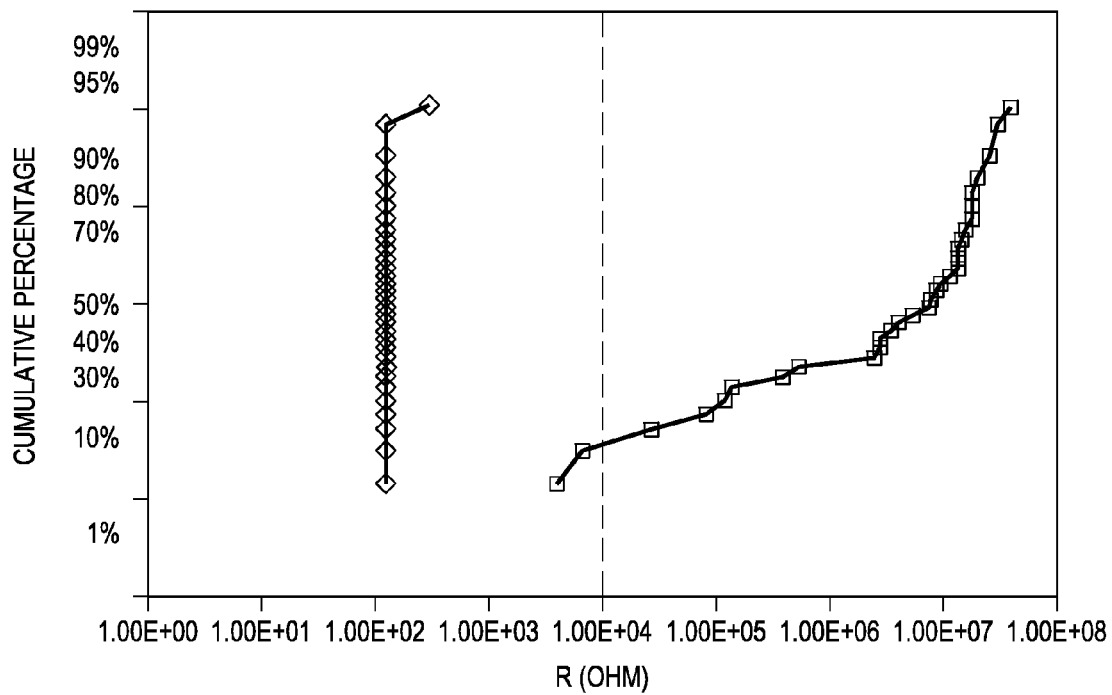
FIGS. 9A-9B compare resistance measured on a post-programmed e-fuse under a single program mode in the prior art and a combined program mode in a preferred embodiment of the present invention.
Figure 9B:
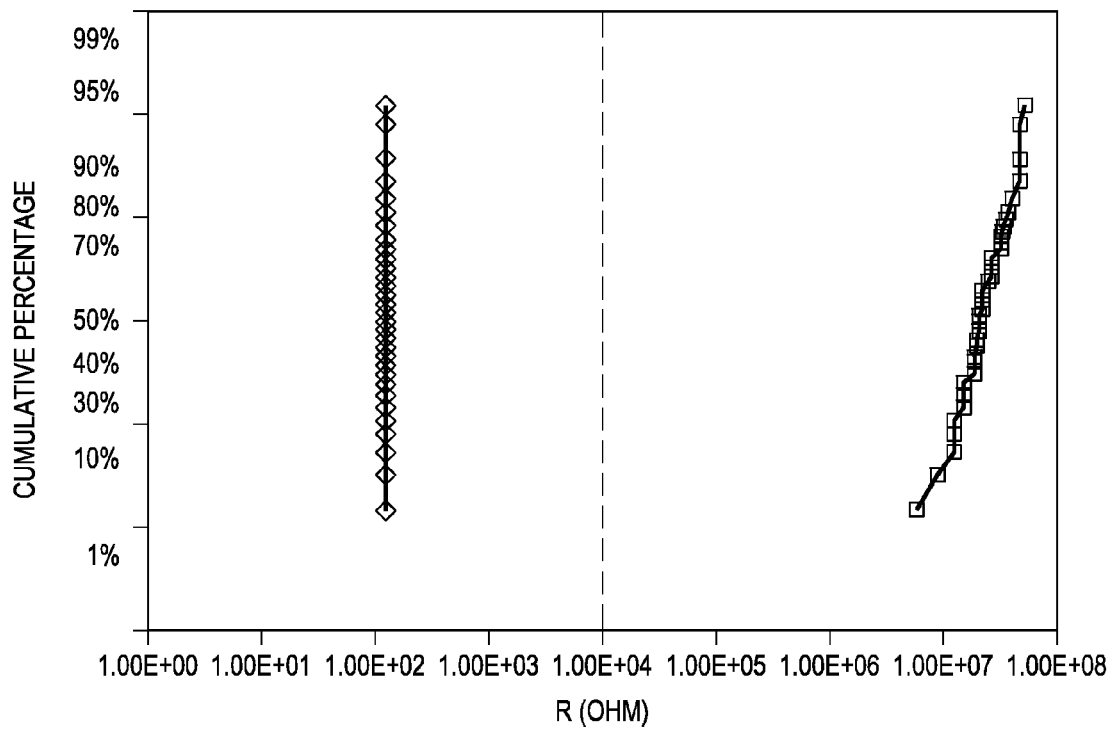

FIGS. 9A-9B illustrate sample data measured on e-fuse 100, demonstrating the advantageous features of the combined programming mode of preferred embodiments. Resistance is measured and plotted based on a plurality of e-fuse samples. The solid diamonds are resistance values before e-fuse 100 is programmed, and the solid squares are resistance values after e-fuse 100 is programmed. The e-fuse samples have a pre-program resistance value of about 100 ohm ($\Omega$). The vertical axis represents the cumulative percentage, which is used to illustrate the distribution of measured resistance on the plurality of e-fuse samples. The vertical line at $1.00E\pm04\Omega$ represents a pre-determined threshold resistance value that is used to distinguish a programmed fuse. In FIG. 9A, a single-phase programming of poly silicide migration mode is used to program the fuse samples. It is revealed that the measured resistances on the post-programmed e-fuse samples are loosely distributed in a range of from a resistance value smaller than the threshold resistance to a value of about $1.5E\pm07\Omega$. This distribution indicates a low repairable rate and reduced IC design window. In FIG. 9B, a two-phase programming is used to program the fuse samples, where a poly silicide migration mode is followed by a contact eletromigration mode. It is revealed from FIG. 9B that the measured resistances on the post-programmed e-fuse samples are tightly distributed in a range of from about $1.5E\pm06\Omega$ to about $1.5E\pm07\Omega$, therefore leading to a desired distinction between an un-programmed fuse and a programmed fuse.

Referring back to FIG. 8D, contact 54 of e-fuse 100 is made of tungsten, and upper-level conductive layer 58 is made of a low melting-point conductive material, such as copper, aluminum, or combinations and other well-known alternatives. Generally, the current density required to blow out e-fuse 100 in the preferred order described above is dependent on factors such as the dimensions and the process for silicide layer 35 and contact 54. In one embodiment, silicide layer 35 is a tungsten silicide layer having a thickness of about 500 Å. The portion of tungsten silicide layer that is a portion of fuse 100 has a length of about 360 nm and a width of about 60 nm, overlying the neck portion $33_1$ of poly strip 33. Also, four contacts 54 (see FIG. 8B) are formed and adapted as a portion of the fuse in fuse 100, each having a dimension of 60 nm by 60 nm. Under a pre-determined programming voltage, the current density in the adapted fuse portion of tungsten silicide layer is typically about $4.70\times10^8$ A/cm$^2$ and with the process variation range from $2\times10^8$ A/cm$^2$ to $1\times10^9$ A/cm$^2$, while the current density in the adapted fuse portion of contact 54 is typically about $4.55\times10^8$ A/cm$^2$ and with the process variation range from about $2\times10^8$ A/cm$^2$ to about $1\times10^9$ A/cm$^2$, the later larger current density tends to occur in the contacts 54 which are closest to the neck portion $33_1$ of poly strip 33

Although there is no special requirement as to the height of contact 54, it is revealed, however, from one embodiment that at least 20% of the height of contact 54 is preferred to be voided in order to obtain the desired post-programming resistance. In general, the voided section of contact 54 is significantly shorter than the distance between two adjacent interconnect metal layers in an IC, where a fuse is typically formed. It is also preferred that tungsten depletion on contact 54 does not exceed 80% of the height of contact 54 in order to avoid low melting-point metal materials in upper-level conductive layer 58 reflowing and refilling void 57, an undired effect explained previously. The remaining tungsten in contact 54 has a high melting-point and functions as a reflow stopper when high temperature occurs in the interconnect metal layers. As a result, the depleted portion 54a of contact 54 accumulates and conglomerates at the shoulder portion $33_2$ of poly strip 33, leaving a remaining portion 54b in contact with upper-level conductive layer 58, as shown in FIG. 8D.

FIG. 10 illustrates a programmed fuse structure in another preferred embodiment, where fuse 110 has a similar structure as fuse 100 illustrated with respect to FIGS. 8A-8D, except that upper-level conductive layer 78 and contact 54 of fuse 110 are both made of high melting-point materials, such as tungsten. A tungsten dual-damascene process may be performed to form contact 54 and upper-level tungsten line 78. In the current embodiment, tungsten depletion in contact 54 during the second phase of programming fuse 200 under the contact electron migration mode may continue until tungsten in contact 54 is completely depleted. The depleted tungsten of contact 54 accumulates and conglomerates at the shoulder portion $33_2$ of poly strip 33, forming tungsten accumulation 57 and leaving void 67 in the region of contact 54. This is because the issue of metal-reflow and metal-refill generally is no longer a concern when high melting-point materials are used for the upper-level conductive layer 78 of fuse 110. In a further preferred embodiment, a different high melting-point metal or metal alloy can be used for upper-level conductive layer 78 and contact 54.

The current density required for blowing out a fuse is dependent on the material, dimension and process used for forming the fuse portion of the silicide layer and the tungsten contact, as noted above. It is noted, however, a preferred range of current density generally exists for a given fuse structure. In preferred embodiments described above with respect to FIGS. 8A-8D and 10, the preferred range of current density in the adapted fuse portions is between $4.55\times10^8$ A/cm$^2$ and $5.20\times10^8$ A/cm$^2$. It is observed that, when current density is below $4.55\times10^8$ A/cm$^2$, the second programming phase in contact 54 under the contact electron migration mode may be inadequately executed, leading to a poor post-programming resistance distribution similar to that shown in FIG. 9A. It is also observed, however, when current density is above $5.20\times10^8$ A/cm$^2$, poly thermal rupture may occur in poly strip 33, causing physical damages therein. Other current density ranges may be used for other fuse configurations.

FIGS. 11A and 11B illustrate applications of preferred embodiments. FIG. 11A illustrates an electrical circuit 148 coupled in series with an e-fuse 140. Electrical circuit 148 may be a circuit being replaced when it malfunctions. When e-fuse 140 is blown out by applying a current through external pads 142 and 144, electrical circuit 148 is disconnected from the other circuits. FIG. 11B illustrates an e-fuse 150 coupled in parallel with a redundant circuit 158. One end of e-fuse 150 is coupled to ground. Therefore the redundant circuit 158 is grounded by e-fuse 150 and not activated. If a circuit element is found defective and needs to be replaced by redundant circuit 158, a voltage is applied to external pads 152 and 154 to blow out the e-fuse 150. When e-fuse 150 is open, redundant circuit 158 is activated. A circuit redundancy scheme can be established by combining the circuits in FIG. 11A and FIG. 11B.

FIG. 12 illustrates a circuit for blowing out a fuse. A fuse 170 is connected in series with a transistor 178, which in this configuration is preferably an NMOS device. The fuse 170 and the transistor 178 are coupled between a high voltage supply node Vcc and a low voltage supply node Vss, wherein the source of transistor 178 is connected to Vss, and the drain is connected to the fuse 170. When a high voltage is applied to gate 178g, transistor 178 conducts, and current flows through and blows out fuse 170. If the fuse to be programmed has a configuration such as those in FIGS. 8A-8D and 10, the cathode of the fuse, which is the contact end, is coupled to a floating node 174, and the anode of the fuse, which is the poly strip end, is coupled to Vcc. When transistor 178 is turned on under a programming instruction, floating node 174 is switched to Vss, and programming on 170 commences.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrical fuse comprising:
an upper conductive layer comprising a first conductive material having a first melting-point;
a lower polysilicon layer having a first region, a second region, and a third region disposed between the first and the second region wherein a width of the third region is smaller than a width of the first region and a width of the second region;
a first contact comprising a second conductive material having a second melting-point higher than the first melting-point, the first contact being coupled to the upper conductive layer and to the first region of the lower polysilicon layer;
a second contact disposed over the second region of the lower polysilicon layer;
a void disposed in a bottom portion of the first contact; and
an accumulation of the second conductive material and silicide metal atoms at the second region of the lower polysilicon layer.

2. The electrical fuse of claim 1 wherein the second conductive material is tungsten.

3. The electrical fuse of claim 1 wherein the first contact comprises tungsten filled in a top portion of a contact opening.

4. The electrical fuse of claim 3 wherein a sidewall of the contact opening is coated with a barrier layer comprising a material selected from the group consisting of titanium, titanium nitride, tantalum, tantalum nitride, silicon carbide, silicon oxycarbide, and the combinations thereof.

5. The electrical fuse of claim 1 wherein the lower polysilicon layer comprises a material selected from the group consisting of non-doped polysilicon, lightly-doped polysilicon, and the combinations thereof.

6. The electrical fuse of claim 1 further comprising a first external pad coupled to the upper conductive layer, and a second external pad coupled to the second contact.

7. The electrical fuse of claim 1 wherein the upper conductive layer comprises a low melting-point conductive material selected from the group consisting of aluminum (Al), copper (Cu), silver (Ag), gold (Au), polysilicon, and the combinations thereof.

8. The electrical fuse of claim 1 wherein the void disposed in the bottom portion of the first contact has a height between about 20% and about 80% of a full height of the first contact.

9. The electrical fuse of claim 1 wherein the first contact has a height between about 500 Å to about 10000 Å.

10. An electrical fuse comprising:
an upper conductive layer that includes a material having a melting-point not lower than that of tungsten;
a lower polysilicon layer having a first region, a second region and a third region, wherein a width of the third region is smaller than a width of the first region and a width of the second region;
a first tungsten contact coupled to the upper conductive layer and the first region of the lower polysilicon layer;
a second tungsten contact disposed over the second region of the lower polysilicon layer;
a void disposed within the first tungsten contact and between the first tungsten contact and the lower polysilicon layer; and
tungsten atoms and silicide metal atoms being accumulated at the second region of the lower polysilicon layer.

11. The electrical fuse of claim 10 wherein the upper conductive layer comprises tungsten.

12. The electrical fuse of claim 10 wherein the first tungsten contact has an inner sidewall, the sidewall coated with a barrier layer comprising a material selected from the group consisting of titanium, titanium nitride, tantalum, tantalum nitride, silicon carbide, silicon oxycarbide, and the combinations thereof.

13. The electrical fuse of claim 10 wherein the lower polysilicon layer comprises a material selected from the group consisting of non-doped polysilicon, lightly-doped polysilicon, and the combinations thereof.

14. An electrical fuse comprising:
an upper conductive layer;
a lower polysilicon layer having a first region, a second region, and a third region, wherein a width of the third region is smaller than a width of the first region and a width of the second region;
a first contact comprising first metal atoms coupled to the upper conductive layer and to the first region of the lower polysilicon layer, a bottom portion of the first contact being depleted of the first metal atoms and forming a void;
a second contact disposed over the second region of the lower polysilicon layer; and an accumulation of the first metal atoms and silicide atoms at the second region of the lower polysilicon layer;

wherein the depleted bottom portion of the first contact has a height between about 20% and about 80% of a full height of the first contact.

15. The electrical fuse of claim 14 wherein the first contact comprises tungsten.

16. The electrical fuse of claim 14 wherein the upper conductive layer comprises a low melting-point conductive material selected from the group consisting of aluminum (Al), copper (Cu), silver (Ag), gold (Au), polysilicon, and the combinations thereof.

17. The electrical fuse of claim 14 wherein the lower polysilicon layer comprises a material selected from the group consisting of non-doped polysilicon, lightly-doped polysilicon, and the combinations thereof.

18. A process of blowing out a fuse, the process comprising:

depleting silicide atoms from a silicide layer disposed on a third region of a polysilicon layer, the polysilicon layer comprising a first, a second, and a third region, the third region being disposed between the first and the second regions, wherein a width of the third region is smaller than both a width of the first region and a width of the second region;

migrating the silicide atoms to the second region of the polysilicon layer; and after depleting the silicide layer, depleting tungsten from a tungsten contact disposed above the silicide layer and coupled to the first region of the polysilicon layer and migrating the tungsten to the second region of the polysilicon layer.

19. The process of claim 18 wherein depleting the tungsten is performed by an electrical current having a current density in the range from about $2 \times 10^8$ A/cm$^2$ to about $1 \times 10^9$ A/cm$^2$.

20. The process of claim 18 wherein depleting the tungsten from the tungsten contact results in a voided bottom portion of the tungsten contact, the voided bottom portion having a height between about 20% and about 80% of a full height of the tungsten contact.

21. The process of claim 18 wherein tungsten contact is coupled to an upper conductive layer made of tungsten.

22. The process of claim 18 wherein depleting the tungsten from the tungsten contact results in a substantially completely voided tungsten contact.

* * * * *